(12) United States Patent
Mutchnik (10) Patent No.: US 11,791,824 B1
(45) Date of Patent: Oct. 17, 2023

(54) VOLTAGE DOMAIN GPIO CONTROL

(71) Applicant: Apple Inc., Cupertino, CA (US)

(72) Inventor: Sharon D Mutchnik, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/741,477

(22) Filed: May 11, 2022

(51) Int. Cl.
   *H03K 19/17788* (2020.01)
(52) U.S. Cl.
   CPC .......................... *H03K 19/17788* (2013.01)
(58) Field of Classification Search
   None
   See application file for complete search history.

(56) References Cited

U.S. PATENT DOCUMENTS

| | | | |
|---|---|---|---|
| 6,487,687 B1 | 11/2002 | Blake et al. | |
| 6,804,728 B2* | 10/2004 | Tanino | G06F 13/124 710/36 |
| 8,502,317 B2 | 8/2013 | Van den Berg et al. | |
| 10,637,475 B2 | 4/2020 | Jain et al. | |
| 11,128,300 B1 | 9/2021 | Hanagami et al. | |
| 2008/0307240 A1* | 12/2008 | Dahan | G06F 1/324 713/320 |
| 2013/0271199 A1* | 10/2013 | Hsu | H03L 5/00 327/333 |
| 2014/0247081 A1* | 9/2014 | Yeung | H03K 19/0185 327/333 |
| 2015/0054563 A1 | 2/2015 | Flynn et al. | |
| 2016/0077995 A1 | 3/2016 | Mishra et al. | |
| 2016/0105181 A1* | 4/2016 | Kerr | H03K 19/0002 326/59 |
| 2020/0244252 A1 | 7/2020 | Kim et al. | |
| 2022/0115941 A1 | 4/2022 | May et al. | |

OTHER PUBLICATIONS

Balachandran, "General Purpose Input/Output (GPIO)," ECE 480 Design Team 3, pp. 1-10, Aug. 11, 2009.
Wikipedia, "Internet of Things," pp. 1-51, last edited Apr. 27, 2022.
International Application # PCT/US2023/015240 Search Report dated Jul. 5, 2023.

* cited by examiner

*Primary Examiner* — Jany Richardson
(74) *Attorney, Agent, or Firm* — KLIGLER & ASSOCIATES PATENT ATTORNEYS LTD (57) ABSTRACT

An integrated circuit (IC) includes an Input/Output (I/O) interface, first-domain circuitry and second-domain circuitry. The I/O interface is coupled to a first voltage domain and is configurable by a set of control bits. The second-domain circuitry is coupled to a second voltage domain and is configured to generate a bit value for a control bit among the control bits, to generate a multi-bit identifier (ID) of the control bit, and to transmit the bit value and the multi-bit ID. The first-domain circuitry is coupled to the first voltage domain and is configured to receive the bit value and the multi-bit ID, to identify the control bit from the multi-bit ID, and to configure the control bit of the I/O interface with the bit value.

19 Claims, 8 Drawing Sheets

VOLTAGE DOMAIN GPIO CONTROL

FIELD OF THE DISCLOSURE

The present disclosure relates generally to integrated circuits, and specifically to cross supply-voltage domain signal propagation in integrated circuits.

BACKGROUND OF THE DISCLOSURE

The General-Purpose Input Output (GPIO) ports of integrated circuits are typically supplied by a voltage level that is different than the supply voltage of other circuits of the integrated circuit, and, hence, the interface between GPIO circuits and other circuits may be done through level shifter circuits.

In "General Purpose Input/Output (GPIO)" (Balachandran, Sasang (2009)), the author asserts that the need to provide flexibility in terms of data input and output is a necessity to create adaptability in microprocessor communication, and the use of General-Purpose Input/Outputs is a realization of open-ended transmission between devices on an embedded level. These pins available on a processor can be programmed to be used to either accept input or provide output to external devices depending on user desires and applications requirements. The variable methods of data handling implemented in these pins, such as ADC conversion and interrupt handling, provide alternative uses that are ideal for multi-input applications.

U.S. Pat. No. 6,487,687 discloses a voltage level shifter with testable cascode devices. According to one embodiment, the level shifter includes multiple cascode devices and switches a first output driver according to the values of a data input and an enable input.

U.S. Pat. No. 11,128,300 discloses a level shifter circuit with an intermediate power domain and method for operating the same. The level shifter circuit includes an input circuit, an output circuit, and an intermediate circuit. The input circuit is coupled to receive an input signal from a first voltage domain operating according to a first supply voltage, and generates a first intermediate signal. The intermediate circuit receives the first intermediate signal and generates a second intermediate signal. The output circuit receives the intermediate signal and provides an output signal into a second voltage domain operating at a second supply voltage different from the first. A voltage multiplexer is configured to provide one of the first or second supply voltages to the intermediate circuit depending on a state of the input signal.

SUMMARY OF THE DISCLOSURE

An embodiment that is described herein provides an integrated circuit (IC) including an Input/Output (I/O) interface, first-domain circuitry and second-domain circuitry. The I/O interface is coupled to a first voltage domain and is configurable by a set of control bits. The second-domain circuitry is coupled to a second voltage domain and is configured to generate a bit value for a control bit among the control bits, to generate a multi-bit identifier (ID) of the control bit, and to transmit the bit value and the multi-bit ID. The first-domain circuitry is coupled to the first voltage domain and is configured to receive the bit value and the multi-bit ID, to identify the control bit from the multi-bit ID, and to configure the control bit of the I/O interface with the bit value.

In some embodiments, the IC further includes multiple level shifters configured to transfer the bit value and the multi-bit ID from the second-domain circuitry to the first-domain circuitry. In an embodiment, a number of the level shifters that are assigned to transfer the multi-bit ID is less than a number of the control bits.

In a disclosed embodiment, the IC further includes a second I/O interface that is coupled to the first voltage domain, the second domain circuitry is further configured to transmit a second bit value, and the first domain circuitry is configured to configure the control bit of the second I/O interface with the second bit value. In another embodiment, the first-domain circuitry includes a plurality of storage elements that are configured to retain respective bit values of the control bits.

In yet another embodiment, the second-domain circuitry includes one or more processor cores configured to communicate with the I/O interface. In still another embodiment, a maximum voltage of the first voltage domain exceeds an operating voltage of the second voltage domain by a factor of at least five.

There is additionally provided, in accordance with an embodiment that is described herein, an integrated circuit (IC) including a plurality of Input/Output (I/O) interfaces, first-domain circuitry and second-domain circuitry. The I/O interfaces are coupled to a first voltage domain and are each configurable by a respective set of control bits. The second-domain circuitry is coupled to a second voltage domain and is configured to generate respective bit values for the control bits, to generate an indication that specifies a subset of one or more of the I/O interfaces that are to be configured with the bit values, and to transmit the bit values and the indication. The first-domain circuitry is coupled to the first voltage domain and is configured to receive the bit values and the indication, to identify the subset of I/O interfaces from the indication, and to configure the I/O interfaces in the subset with the bit values.

There is also provided, in accordance with an embodiment that is described herein, an integrated circuit (IC) including multiple Input/Output (I/O) interfaces, first-domain circuitry and second-domain circuitry. The I/O interfaces are coupled to a first voltage domain and are each configurable by a respective set of control bits. The second-domain circuitry is coupled to a second voltage domain and includes (i) multiple processing cores and (ii) control circuitry, the control circuitry being configured to control at least one of the I/O interfaces by generating a bit value for a control bit among the control bits, generating a multi-bit identifier (ID) of the control bit, and transmitting the bit value and the multi-bit ID. The first-domain circuitry is coupled to the first voltage domain and is configured to receive the multi-bit ID, to identify the control bit from the multi-bit ID, and to configure the control bit of the I/O interface with the bit value.

There is further provided, in accordance with an embodiment that is described herein, a method including operating an Input/Output (I/O) interface, which is coupled to a first voltage domain and is configurable by a set of control bits. Using second-domain circuitry, coupled to a second voltage domain, a bit value is generated for a control bit among the control bits, a multi-bit identifier (ID) of the control bit is generated, and the bit value and the multi-bit ID are transmitted. Using first-domain circuitry, coupled to the first voltage domain, the bit value and the multi-bit ID are received, the control bit is identified from the multi-bit ID, and the control bit of the I/O interface is configured with the bit value.

There is also provided, in accordance with an embodiment that is described herein, a method including operating a plurality of Input/Output (I/O) interfaces, which are coupled to a first voltage domain and are each configurable by a respective set of control bits. Using second-domain circuitry, which is coupled to a second voltage domain, respective bit values are generated for the control bits, an indication specifying a subset of one or more of the I/O interfaces that are to be configured with the bit values is generated, and the bit values and the indication are transmitted. Using first-domain circuitry, which is coupled to the first voltage domain, the bit values and the indication are received, the subset of I/O interfaces is identified from the indication, and the I/O interfaces in the subset are configured with the bit values.

The present disclosure will be more fully understood from the following detailed description of the embodiments thereof, taken together with the drawings in which:

DETAILED DESCRIPTION OF EMBODIMENTS

Overview

To achieve higher speeds and lower power dissipations, high density integrated circuits (ICs) typically use a low-voltage power supply (e.g., 0.6V) for the logic core. For the Input and Output (I/O), however, a higher voltage power supply is often used (e.g., 1.8V, 3.3V or higher), to comply with existing inter-IC interface specifications. We will refer to circuits that operate at the I/O power supply as Vdd1-domain circuits, and to the core and other circuits that operate at the core power supply as Vdd2-domain circuits (integrated circuits may have additional Vdd domains, for various types of circuits).

I/O circuits that are used in ICs vary in functionality. Some I/O circuits are input only, others are output only and yet other are bidirectional Input/Output circuits. Input circuits may sometimes have a Schmidt configuration and/or resistive pull-up or a resistive pull-down (other configurations may be used, some of which will be described below). Integrated circuits sometimes include configurable general purpose I/O (GPIO) circuits, which may be set, typically during IC initialization (for example, by a processor in the IC), to the desired functionality. Such GPIOs may be configured by a plurality of control bits (e.g., nine or eleven bits).

To transfer the levels of external signals to the IC core, Vdd1 domain signals from the I/O circuits should be voltage-shifted to Vdd2; conversely, to transfer Vdd2 logic signals from the IC core to external signals, Vdd2 to Vdd1 voltage shifting is needed. (The wires on which external signals are input to the IC core are referred to as bit-in wires; The wires on which external signals are output from the IC core are referred to as bit-out wires. Collectively, the bit-in and bit-out wires are referred to as bit-lines.)

When a processor or other circuitry in the core programs the I/O circuits configuration, further level shifters are needed.

Voltage level shifters, however, are typically large, consume a significant amount of power, and, in some cases, present a reliability bottleneck. For an example voltage shifter, see U.S. Pat. No. 8,502,317, which describes a level shifter circuit for integrated circuits having one or more inputs that operate in a first voltage domain, and a signal output that operates in a second voltage domain.

Embodiments according to the present disclosure provide circuits and methods for the programming of GPIOs in an integrated circuit, using a small number of voltage level shifters. GPIOs are also referred to herein as "GPIO devices", "I/O buffers" or "I/O interfaces". All these terms are used interchangeably herein.

In a disclosed bit-serial programming embodiment, a vdd2 circuit encodes an identifier (ID) of a selected GPIO control bit to be programmed; while the logic core sends the value to be programmed, separately for multiple (e.g., all) GPIOs, on the corresponding bit-out wires. The logic core may also send a write pulse, which is voltage-level-shifted and used as a write input in the multiple (e.g., all) registers. In some embodiments, a vdd1 decoder converts the bit-ID to a one-hot bus, wherein a set bit indicates the selected control register bit. In an embodiment, the bit-in wires may be used to read the contents of the selected control register bit, of multiple (e.g., all) GPIOs.

The disclosed technique enables programming of GPIOs with a reduced number of voltage shifters, thereby reducing the IC size and power consumption.

In a disclosed bit-parallel programming embodiment, a vdd2 circuit sends the full contents to be programmed in the GPIO control register. In parallel, the logic core sends an indication that specifies a subset of one or more of the GPIOs that should be programmed, on the bit-out wires. The bit-parallel embodiments may be more efficient that the bit-serial embodiments when the number of groups of GPIOs having identical configuration is smaller than the number of control register bits.

DESCRIPTION OF EXAMPLE EMBODIMENTS

I/O buffers of high-density integrated circuits typically operate at a power supply voltage that is significantly higher than the voltage of the core power supply. For example, while the core operating voltage may be 0.6V, the I/O power supply voltage may be as high as 5 to 10V (e.g., 6V). When using configurable general-purpose I/O (GPIO) buffers, which are programmed during initialization or during other configuration sequences, the core (typically a processor in the core) sends configuration data to the GPIO buffers through a series of voltage level converters ("voltage shifters"), which are typically large, consume a lot of power and degrade the IC reliability.

Figure 1:
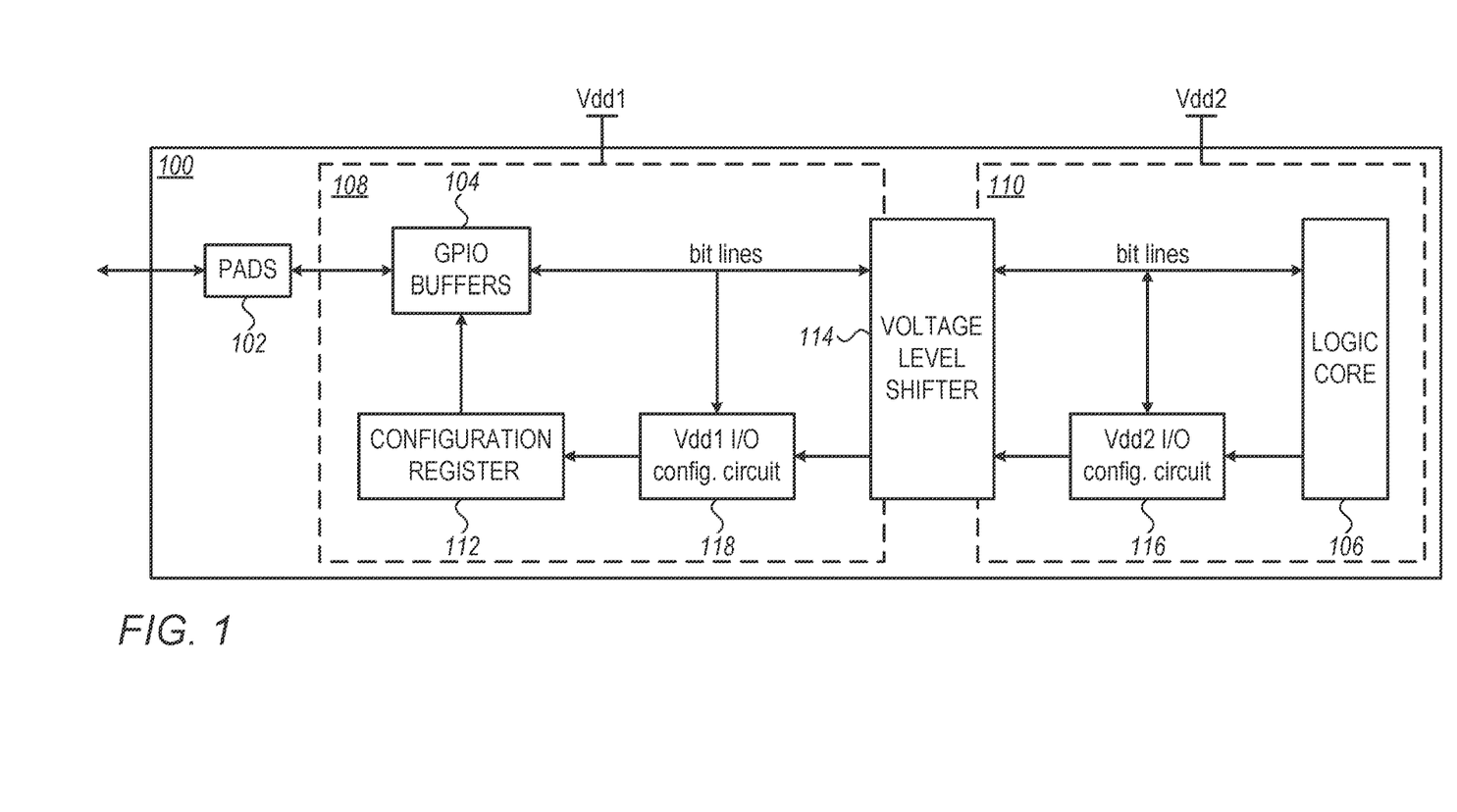
FIG. 1 is a block diagram that schematically illustrates the structure of an integrated circuit (IC), in accordance with an embodiment of the present disclosure.

FIG. 1 is a block diagram that schematically illustrates the structure of an integrated circuit (IC) 100, in accordance with an embodiment of the present disclosure. IC 100 includes pads 102 that are coupled to external circuits (not shown), GPIO buffers 104 (also referred to as I/O interfaces) that are coupled to the pads, and a Core Logic 106. In embodiments, Core Logic 106 may include any digital circuitry, including, for example, one or more processors.

In an embodiment, IC 100 may include two or more power-supply domain, each domain including circuits that are powered by a different power supply input; the domains are typically isolated from each other (for example, to avoid bipolar latch-up). IC 100 includes a Vdd1 power domain 108, and a Vdd2 power domain 110. GPIO buffers 104 are powered by vdd1 and, hence, are in vdd1 domain 108. In some embodiments, Vdd1 is defined so that the output and input signals of IC 100 will comply with inter-chip communication standards; Logic Core 106 is Vdd2 power domain 110; in embodiments, Vdd2 is optimized for high speed, compatible with fast thin oxide gates used in high density semiconductor devices. (In some embodiments, IC 100 may have additional power supply domains, for other purposes.) According to the example embodiment illustrated in FIG. 1, each one of GPIO buffers 104 is controlled by a respective configuration register 112; in some embodiments, the configuration register may configure the GPIO buffer as an input buffer, as an output buffer or a bidirectional input-output buffer; in embodiments, the configuration register configures the drive strength of the output buffer and in other embodiments a Schmidt input buffer may be configured (other GPIO buffer configuration options will be described below, with reference to FIG. 2). As the configuration register controls the GPIO buffers, the configuration register is in Vdd1 domain 108.

In embodiments, to transfer data between Vdd domains, voltage level converters are used (for an example inter-voltage-domain level shifter, the reader is referred to U.S. Pat. No. 8,502,317). In some embodiments, the maximum voltage of the vdd1 domain exceeds the operating voltage of the vdd2 domain by a factor of at least five. Typically, voltage level shifters are large, consume a significant amount of power and lower the reliability (e.g., the mean lifetime) of the integrated circuit. In the example embodiment illustrated in FIG. 1, Voltage Level Shifters 114 convert signals that the Vdd2 circuits send to Vdd1 circuits, and, in the opposite direction, signals that Vdd1 circuits (e.g., GPIO buffers 104) send to Vdd2 circuits.

Voltage Level Shifters 114 convert the signals that the input-buffers of GPIO buffers 104 generate (referred to as input bit-lines) to Vdd2 voltage domain and convert Vdd2-domain signals that Logic Core 106 outputs (referred to as bit-line outputs) to Vdd1 domain inputs to output buffers of GPIO buffers 104. (The bit-line input and bit-line output are collectively designated "bit-lines". In FIG. 1 both vdd1-domain bit-lines and vdd2-domain bit-lines are denoted "bit-lines".) When Logic Core 106 configures the GPIO buffers, the logic core sends configuration data to configuration register 112. The number of configuration bits may be large; for example, if there are 200 GPIO buffers, and each GPIO buffer has nine configuration bits, the total number of programming bits may be 1800. According to the example embodiment illustrated in FIG. 1, the number of voltage level shifters to convey the GPIO programming data is significantly lower that the number of configuration bits.

In an embodiment, IC 100 includes a Vdd2-I/O Configuration Circuit 116, which may encode the configuration data. The Vdd2-I/O Configuration Circuit sends the encoded configuration data to voltage lever shifter 114, and the corresponding Vdd1-domain signals are input to a Vdd1-I/O Configuration Circuit 118, which decodes the encoded data and programs Configuration Register 112 responsively to decoded data. As will be described below (with reference to FIGS. 3 and 5), the number of level shifters thus needed is significantly lower than the number of programming bits.

In embodiments, the bit-line that the Logic Core sends to or receives from the pads is also coupled to the vdd2 I/O configuration circuit, and the vdd1 I/O configuration circuit programs configuration register 112 responsively to data that vdd2 I/O circuit sends to the vdd1 I/O configuration circuit directly (through the voltage level shifters) and to the data the vdd2 I/O configuration circuit sends over the bit-lines.

The configuration of integrated circuit 100 illustrated in FIG. 1 and described hereinabove is an example that is cited for the sake of conceptual clarity. Other configurations may be used in alternative embodiments. For example, there may be groups of GPIO buffers in more than one Vdd domain. In some embodiments, some of the GPIO buffers may have a fixed configuration and no configuration registers.

Figure 2:
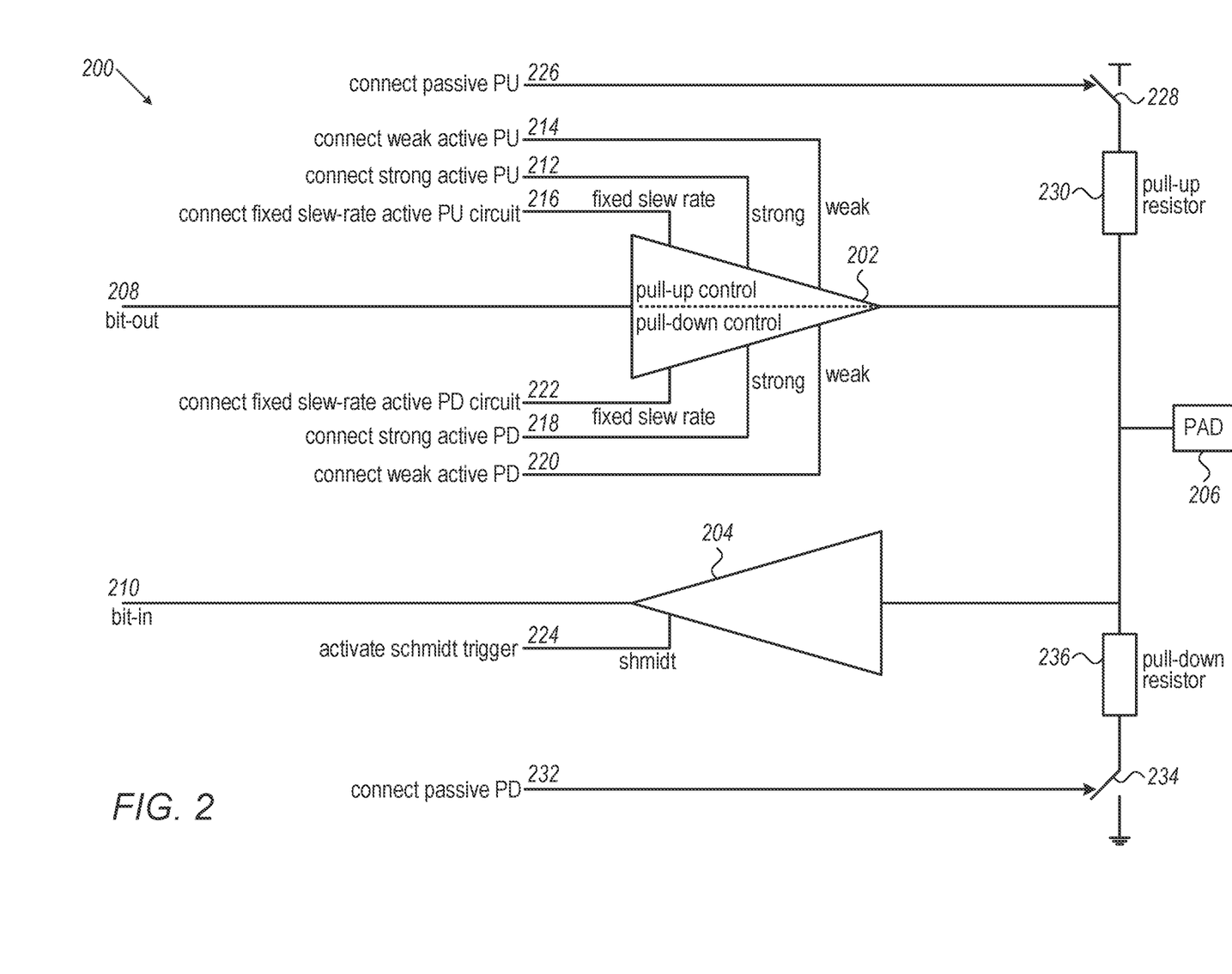
FIG. 2 is a block diagram that schematically illustrates a GPIO pad circuit, in accordance with an embodiment of the present disclosure.

FIG. 2 is a block diagram that schematically illustrates a GPIO pad circuit 200, in accordance with an embodiment of the present disclosure. The GPIO pad circuit includes an output buffer 202, an input buffer 204 and a pad 206. The pad is coupled to the output buffer and to the input buffer; The output buffer is coupled to a bit-out wire 208, and the input buffer is coupled to a bit-in wire 210.

According to the example embodiment illustrated in FIG. 2, output buffer 202 receives six control inputs: (i) a Connect Strong Active Pull-Up input 212, which controls the output buffer to connect a strong pull up device to Pad 206; (ii) a Connect Weak Active Pull-Up input 214, which controls the output buffer to connect a weak pull up device to the Pad; (iii) a Connect Fixed Slew-Rate Active Pull-Up input 215, which controls the output buffer to connect a positive fixed-slew rate circuit to the Pad (a fixed slew rate circuit is configured to produce a linear v(t) slope); (iv) a Connect Strong Active Pull-Down input 218, which controls the output buffer to connect a strong pull down device to the Pad; (v) a Connect Weak Active Pull-Down input 222, which controls the output buffer to connect a weak pull down device to the Pad; and, (vi) a Connect Fixed Slew-Rate Active Pull-Down input 215, which controls the output buffer to connect a negative fixed-slew rate circuit to Pad 206.

Input Buffer 204 receives an Activate Schmidt Trigger input 224, which sets the input buffer in a Schmidt-Trigger configuration (in which the transition threshold for a rising edge at the input signal is higher than the threshold for a falling edge).

GPIO buffer 200 is further configured to couple passive pull-up and pull-down devices to pad 206. A Connect Passive Pull-Up input 226 closes an electronic switch 228, which couples the Vdd supply to the pad through a pull-up resistor 230. Similarly, a Connect Passive Pull-Down input 232 closes an electronic switch 234, which couples the Vss supply (e.g., ground) to the pad, through a pull-down resistor 236.

Thus, according to the example embodiment illustrated in FIG. 2, by controlling nine inputs, a GPIO buffer can be set to one of a plurality of configurations.

The configuration of GPIO buffer 200 illustrated in FIG. 2 and described hereinabove is an example that is cited for the sake of conceptual clarity. Other GPIO configurations may be used in alternative embodiments. For example, in an embodiment, the GPIO may have additional control inputs (e.g., for connecting a medium-strength pull-up or pull-down device); in another embodiment, the GPIO will may have less control inputs (for example, a single weak or strong control may be used to define the strengths of both the pull-up and the pull-down devices). In other embodiments, the GPIO may be controlled by more inputs allowing additional and/or different functionality. In yet other embodiments a smaller number of inputs are used, with reduced and/or different functionality.

Figure 3A:
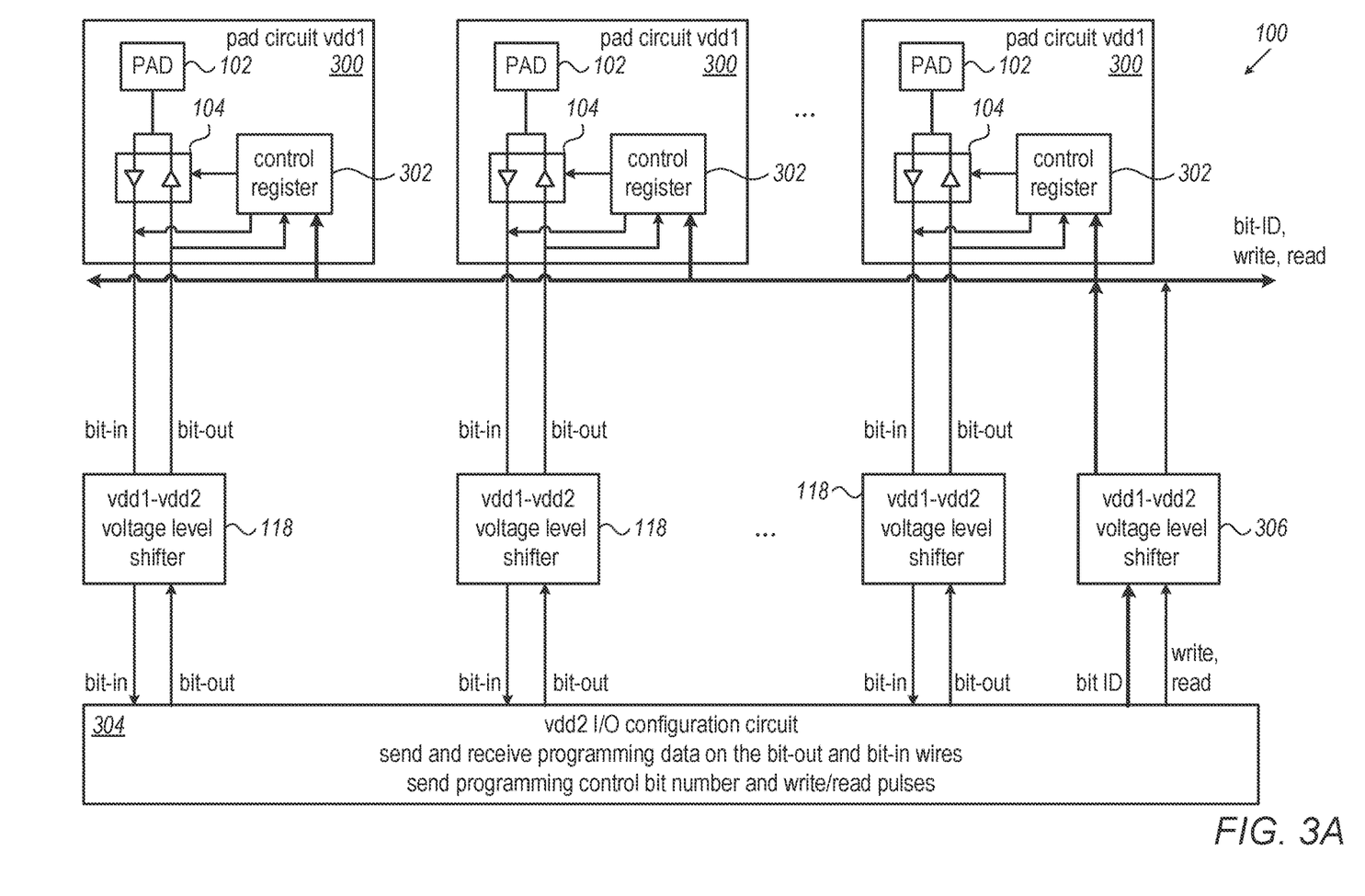
FIG. 3A is a block diagram that schematically illustrates bit-serial GPIO configuration in an IC, in accordance with an embodiment of the present disclosure.

FIG. 3A is a block diagram that schematically illustrates bit-serial GPIO configuration in IC 100, in accordance with an embodiment of the present disclosure.

IC 100 includes vdd1-domain pad circuits 300; each pad circuit including a pad 102 and a GPIO 104 (both illustrated in FIG. 1 and described above). To control the GPIO operation, pad circuit 300 further includes a control register 302 (will be described below, with reference to FIG. 3B).

I/O buffers 104 are connected, through voltage level shifters 118 (FIG. 1), to bit-in and bit out ports of a vdd2 I/O configuration circuit 304.

To program or to read a single bit of control register 302 (in all or in some of pad circuits 300), a vdd2 I/O control circuit 304 outputs a bit-ID of the bit to be programmed. (E.g., if control register 112 includes nine bits, the bit ID may be a four-bit signal, wherein in a 0x0000 represent bit 0, 0x0001 represents bit 1, etc.). The vdd2 I/O configuration circuit further includes a write output and a read output; to program or to read the control register bit, the vdd2 I/O configuration circuit sends a pulse on the write or the read output respectively. The bit-ID, the write output and the read output are input to a voltage level shifter 306, which converts the vdd2 the write and read wires, as well as the vdd2 bit ID, to corresponding vdd1 write, read and bit-ID signals.

The vdd1-domain bit-ID, the read signal, and the write signal are connected to all pad circuits 300. A set of Voltage Level Shifters 118 converts the vdd1-domain input and output signals to Vdd2-domain bit-in and bit-out signals.

When receiving a write signal, Control Register 302 is configured to write the logic value present in the vdd1-domain bit-out wire to a flip-flop that corresponds to the input ID; when receiving a read signal, the Control Register drives the vdd1-domain bit-in wire with the data that is stored in the flip-flop corresponding to the ID. Vdd1-vdd2 voltage level shifters 118 translate the data to be written into the flip-flops from vdd2 domain to vdd1 domain, and the data read from the flip-flops from vdd1 domain to vdd2 domain.

Thus, using a small number of voltage shifters, all control register bits can be read and written; the number of write pulses to configure all n bits of all GPIOs is n, for any number of GPIO buffers (as all GPIOs are written simultaneously); the number of read pulses to read all n register bits of all GPIOs is, again, n.

Figure 3B:
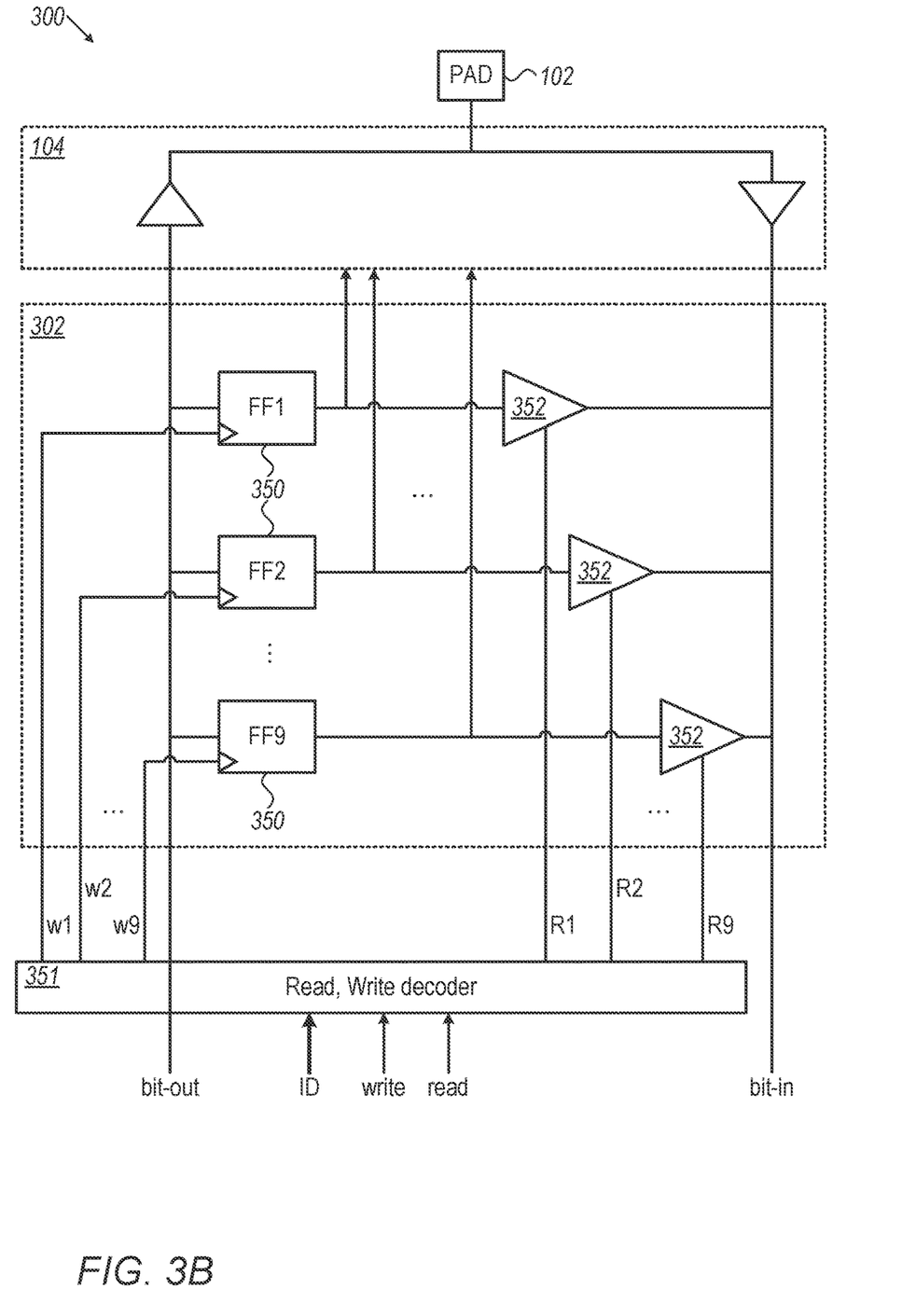
FIG. 3B is a block diagram that schematically illustrates a GPIO control register, in accordance with an embodiment of the present disclosure.

FIG. 3B is a block diagram that schematically illustrates a pad circuit 300, in accordance with an embodiment of the present disclosure. The pad circuit includes a Pad 102, a I/O buffer 104 (both illustrated in FIG. 1), and a Control Register 302 (FIG. 3). Control Register 302 includes control bits, stored in flip-flops 350, to control the configuration of I/O buffer 104. According to the example embodiment illustrated in FIG. 3B, there are nine flip-flops 350, to configure nine control inputs of I/O buffers 104 (e.g., the nine control inputs described above, with reference to FIG. 2).

Pad-circuit 300 further includes Read-Write-Decoder 351, which drives a write bus (w1 to w9) and a read bus (RO to R9). When the Write input is set, the Read-Write-Decoder drives one of the write bus wires, respectively to the ID input, high; conversely, when the read input is high the Read-Write-Decoder drives one of the read bus wires high, according to the ID (in some embodiments, the write input signal is a write pulse, and the selected write-bus wire is pulsed).

Flip-Flops 350 are d-type, having a clock input and a data input. The D inputs of all nine flip-flops are connected to the bit-out wire, while the clock inputs of the flip-flops are connected to the corresponding write-bus wires that decoder 351 outputs. Thus, when there is a pulse on one of the write bus wires, the corresponding flip-flop will latch the bit-out data.

The outputs of flip-flop 350 are wired to the inputs of three-state buffers 352, whereas the outputs of the three-state buffers are connected to the bit-in signal. The enable inputs of buffers 352 are connected to the read-bus wires. Thus, when Read-Write-Decoder 351 asserts one of the read-bus wires, a corresponding three-state buffer 352 will drive the logic value of the corresponding flip-flop on the bit-in wire.

In some embodiments, to avoid contention on the bit-in wire, a multiplexer is added to pad circuit 300, which selects, responsively to the read bus wires, a drive source to the bit-in wire from one of flip-flops 350 or (if no read bus wire is active), from input buffer 204; in other embodiments, control register 302 forces the input buffer of I/O buffer 104 to an off state (e.g., disables bit-in driving by the buffer) when any of the read bus wires is active.

The configuration of IC 100, including pad circuit 300, illustrated in FIGS. 3A, 3B and described hereinabove is cited as an example. Other configurations may be used in alternative embodiments. For example, in some embodiments, decoder 351 sends a one-hot pulse on a register-select bus (e.g., nine bit), and a single write signal; control register 302 will always read the register data onto the bus-in wire and write a register bit from bit-out if write is active. In embodiments, there is a single decoder 351, shared by all or by some of I/O circuits 300.

In other embodiments of the present disclosure, all the bits of GPIO control register may be written using a single write pulse. This is useful when there is a small number of configurations for all GPIOs in the IC (for example, a group of outputs, a group of Schmidt inputs and a group of non-Schmidt inputs).

Figure 4:
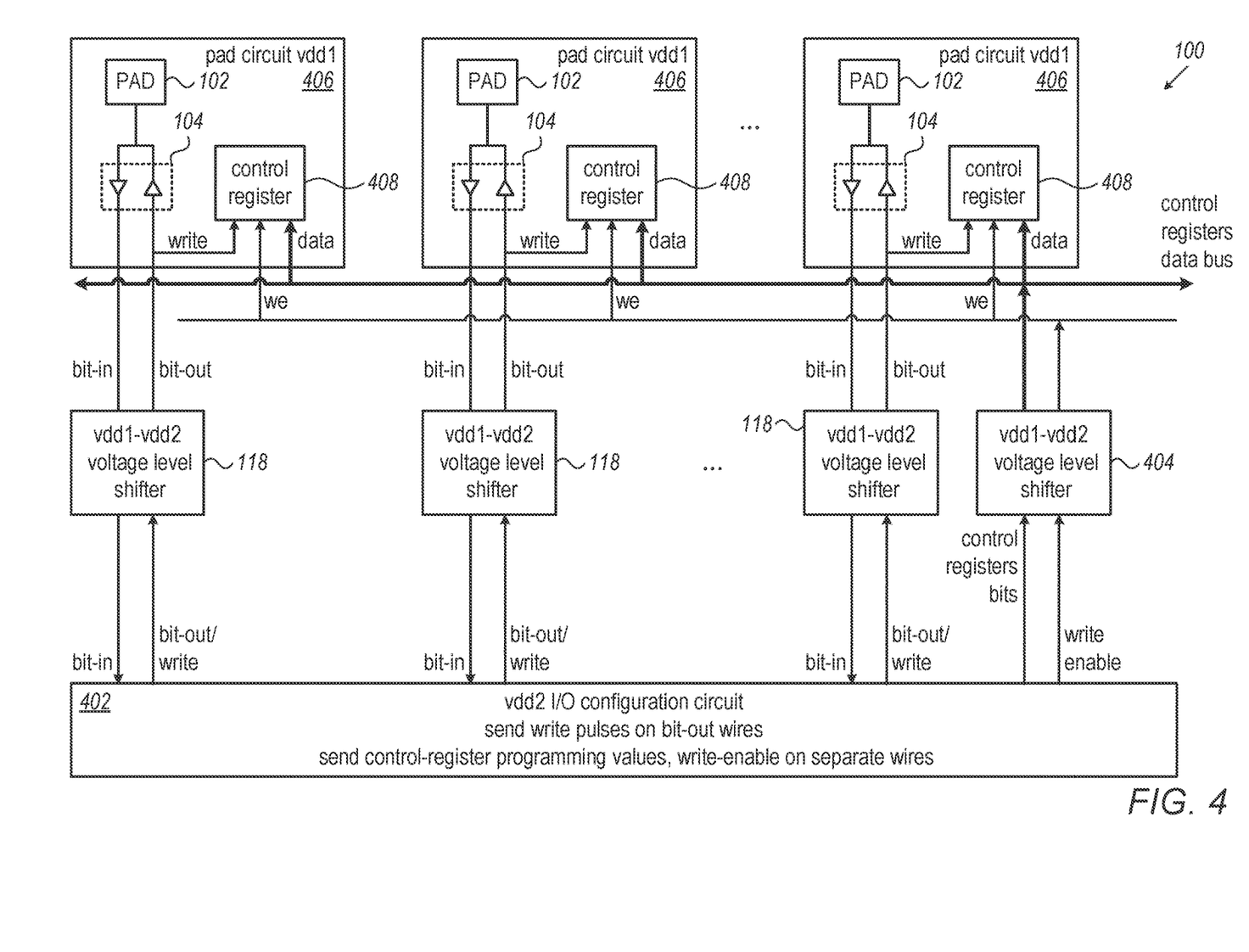
FIG. 4 is a block diagram that schematically illustrates bit-parallel GPIO configuration in an IC, in accordance with an embodiment of the present disclosure.

FIG. 4 is a block diagram that schematically illustrates bit-parallel GPIO configuration in IC 100, in accordance with an embodiment of the present disclosure. A Vdd2 I/O configuration circuit 402 drives a vdd2 control-register bus, including the required values of all control register bits, and a write-enable signal, which are coupled to a voltage level shifter 404; the voltage level shifter generates a corresponding vdd1-domain control register data bus and a corresponding vdd1 write enable signal.

vdd2 I/O configuration circuit 402 further sends, on the bit-out wires of the GPIO buffers to which the control register bus should be written, a write pulse.

IC 100 includes pad circuits 406, each pad circuit including a pad 102 and an I/O buffer 104 (FIG. 1), and a bit-parallel programmable control register 408, which is configured to, responsively to a write pulse on the bit-out wire, write the control register bus in parallel to all the register bits.

Thus, all GPIO buffers of the IC that are to have the same configuration can be programmed with a single write pulse.

For simplicity, the example embodiment illustrated in FIG. 4 does not show circuitry to read the control register bits. In some embodiments, reading the bits is not needed; in other embodiments the bits can be read serially, using a mechanism similar to the read mechanism described above, with reference to FIGS. 3A and 3B. In yet other embodiments, a read bus and a read-enable are added, and the control bits (of a single GPIO at a time) can be read in parallel.

The configuration of IC 100, illustrated in FIG. 4 and described hereinabove, is cited as an example. Other configurations may be used in alternative embodiments. For example, the write-enable may be set on the bit-out wires, whereas the write pulse may be sent in parallel to all GPIO buffers.

Figure 5:
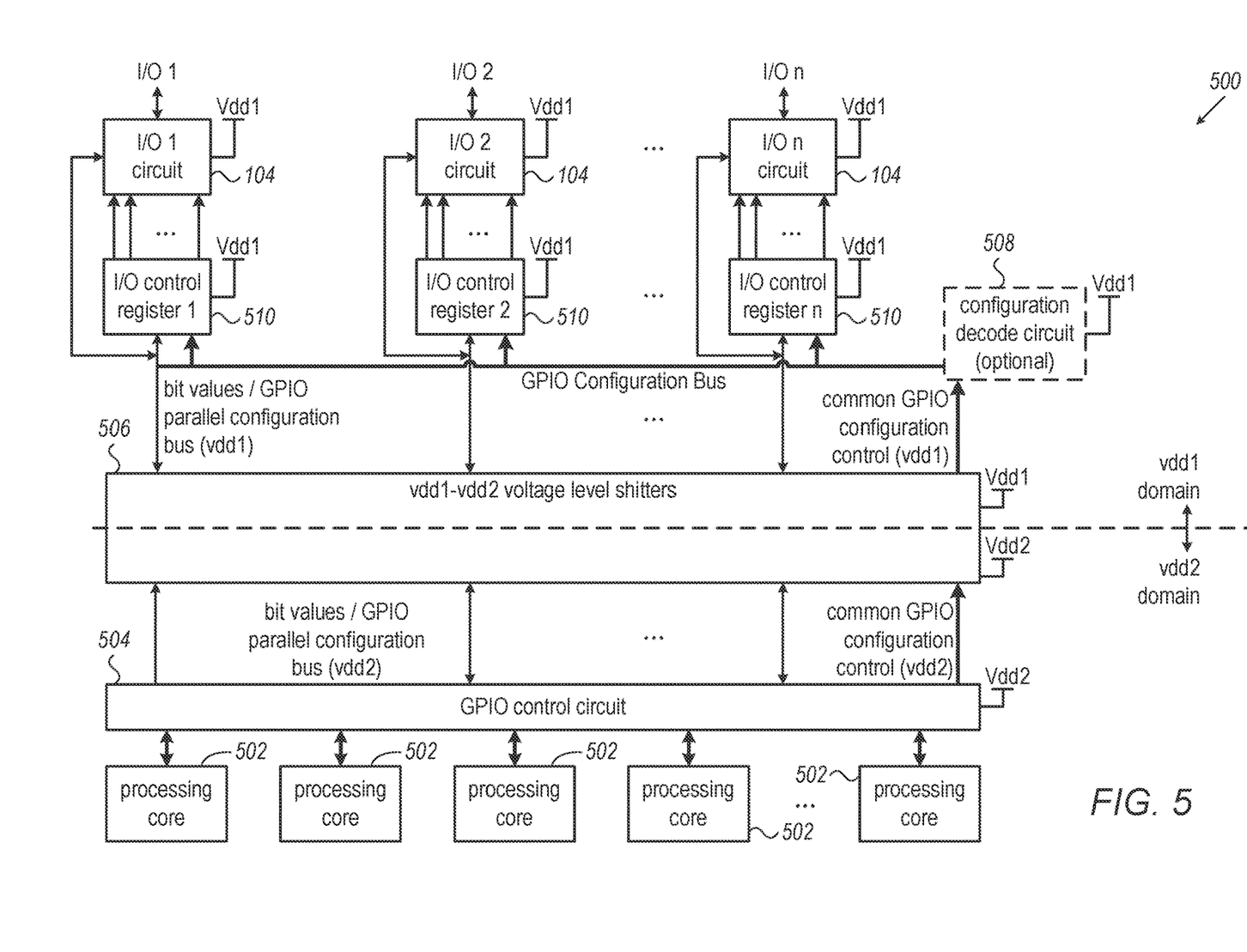
FIG. 5 is a block diagram that schematically illustrates GPIO configuration in a System-on Chip (SoC), in accordance with an embodiment of the present disclosure.

FIG. 5 is a block diagram that schematically illustrates GPIO configuration in a System-on Chip (SoC) 500, in accordance with an embodiment of the present disclosure. In embodiments, SoC 500 may include any variety of digital and analog circuits, including (but not limited to) one or more central processing units (CPUs), Graphic processors units (GPUs), digital signal processors (GPUs), wireless modems, neural networks, and many others. In the example embodiment illustrated in FIG. 5 SoC 500 includes a plurality of processing cores 502.

SoC 500 includes two voltage domains—a Vdd1 voltage domain for communicating with the external circuits, and a Vdd2 voltage domain, for processing cores 502. In an embodiment, Vdd1 voltage is substantially higher than Vdd2. In an example embodiment, Vdd1 voltage may be 5V to 10V whereas Vdd2 may be 0.6V (in some embodiments, an interim voltage shifter shifts the 0.6V signals to an intermediate 0.8V domain) In some embodiments, SoC 500 may include additional Vdd domains, for circuits which may require other operating voltages.

To communicate data with the external circuits (e.g., integrated circuits) that are external to the SoC (not shown), processors 502 are coupled to a vdd2-domain GPIO Control Circuit 504, which communicates inputs and outputs between the processing cores and the external circuits. The GPIO Control Circuit sends and receives vdd2 bit-lines, through a vdd1-vdd2 voltage level shifters that convert the vdd2 bit lines to vdd1 bit lines (and vice-versa), to I/O circuits 104 (FIG. 1), which, in turn, communicate with the external circuits.

I/O circuits 104 are controlled by vdd1-domain I/O control registers 510, each I/O control register having multiple bits to control multiple (e.g., nine or eleven) functions of a corresponding I/O circuit. To configure the I/O control registers, GPIO control circuit 504 sends common GPIO configuration control signals (vdd2 domain) to the vdd1-vdd2 voltage level shifters, which convert the signals to a corresponding vdd1 group of GPIO configuration control signals.

In some embodiments, the GPIO configuration control signals include a bit-number ID that indicates one of the I/O control register bits, a write signal, and a read signal (similarly to the mechanism described above, with reference to FIG. 3A). In other embodiments, the GPIO configuration control signals may include the control bit values and a write-enable indication (similarly to the mechanism of FIG. 4); in yet other embodiments, any other suitable combination of configuration information may be used.

In some embodiments, the vdd1 GPIO configuration control signals are input to a vdd1 configuration decode circuit, which outputs a vdd1 GPIO configuration bus. In other embodiments, the GPIO configuration bus includes a one-hot bus that indicates a bit of the I/O control registers to be programmed (for all I/O control registers concurrently). In yet other embodiments, all bits of the I/O control register will be programmed concurrently, and the GPIO configuration bus indicates the programmed value for all bits. In an embodiment, configuration decode circuit 508 is not used and, instead, the GPIO configuration bus includes the vdd1 common configuration control.

The GPIO configuration bus is input to I/O Control Registers 510. Each I/O Control Register includes flip-flops to store the I/O buffer control bits and read/write logic which writes and reads the flip-flops responsively to the decoded GPIO configuration bus and to the bit-out signals. In some embodiments, the decoded GPIO configuration bus indicates a bit of the control-register to be programmed, whereas the bit-out signals indicate, for each control register, logic value to be programmed. In other embodiments, the decoded GPIO configuration bus indicates the values to be programmed to all bits of the control register, whereas the bit-out lines indicate whether the corresponding control registers should be programmed. In an embodiment, the GPIO configuration bus includes a vdd2 write pulse that the vdd1-vdd2 voltage shifters convert to a vdd1 write pulse; the GPIO configuration bus includes the write pulse, which is then used to time the writing of the registers. In another embodiment, the write pulse is sent on the bit-out wires, and in yet other embodiments a combination of write pulse and write enable signals may be used, transferred on the GPIO configuration bus and/or the bit-out signals.

In some embodiments, the GPIO control circuit can read the configuration control registers. In an embodiment, the GPIO sends a vdd2 read signal; the vdd1-vdd2 voltage shifters convert the read signal to a vdd1 read signals, which the configuration decode circuits sends to the I/O control registers. In an embodiment, the I/O control registers send the stored configuration data on the bit-in lines; in another embodiment the stored configuration data is sent on the GPIO configuration bus.

The configuration of SoC 500 illustrated in FIG. 5 and described hereinabove is an example that is cited merely for conceptual clarity. Other configurations may be used in alternative embodiments. For example, in some embodiments there may be more than one configuration decode circuit, each controlling the configuration of a separate group of physically adjacent GPIOs. In an embodiment, configuring the I/O control register is done concurrently for all control register bits, whereas reading is done one bit at a time.

Bit Parallel Vs. Bit Serial Considerations

To choose between a bit-serial and a bit-parallel I/O configuration embodiments, the following should be considered:

In terms of programming time, programming the control registers of all GPIOs takes n write cycles using a bit-serial embodiment, and m write cycles using a bit-parallel embodiment, where n is the number of control register bits and m is the number of the I/O circuits.

In terms of voltage level shifters, in the bit-serial embodiments, vdd2-circuits send an ID of the bit identifier, using $\log_2 n$ wires (rounded up to the nearest integer), whereas in bit-parallel embodiments a bus of n vdd2 wires is used.

Lastly, in bit-parallel embodiments, reading of the control register bits is more complex.

Figure 6A:
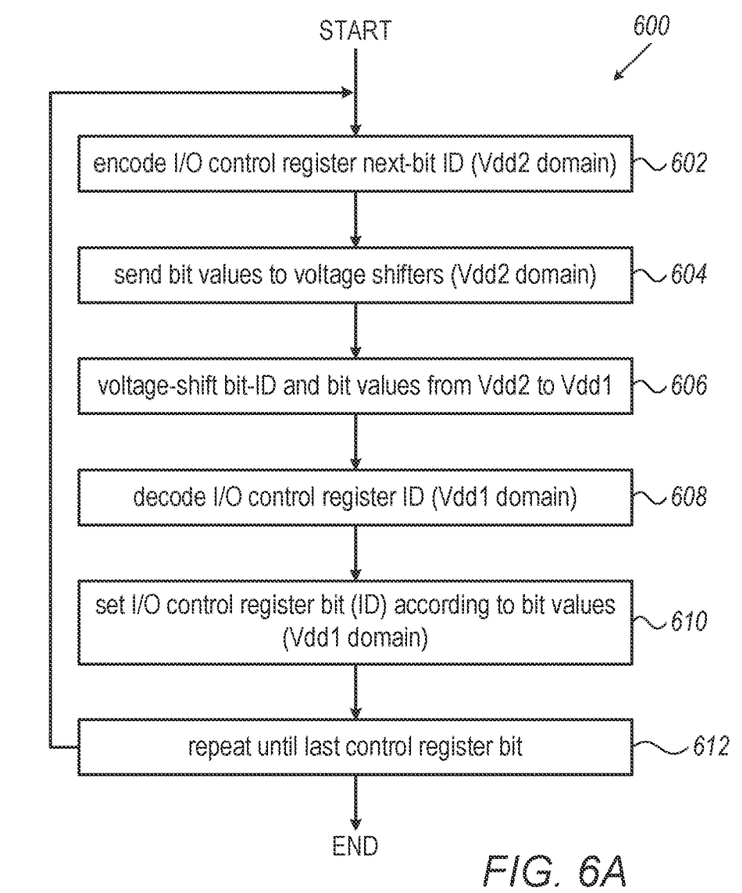
FIG. 6A is a flowchart that schematically illustrates a method for cross voltage domain bit-serial GPIO configuration in an IC, in accordance with an embodiment of the present disclosure.

FIG. 6A is a flowchart 600 that schematically illustrates a method for cross voltage domain bit-serial GPIO configuration in an IC, in accordance with an embodiment of the present disclosure. The flowchart is executed by vdd2 I/O configuration circuit 304, voltage level shifters 118, voltage level shifter 306 and decoder 308 (all illustrated in FIG. 3A).

The flowchart starts at an Encode Control Register Next-bit ID operation 602, wherein the vdd2 I/O configuration circuit outputs a bit ID corresponding to the next control register bit (starting from a first bit) to be programmed. Next, at a send-bit-values operation 604, the vdd2 I/O configuration circuit sends the logic values to be programmed to the selected control-register bit, for all GPIOs, on the bit-out wires.

At a Voltage Shift operation 606, the voltage level shifters then create vdd1 versions of the bit-ID and bit values. Decoder 306, at a Decode operation 608, decodes the bit ID and generates a one-hot bus, wherein one of the wires, corresponding to the control register bit to be programmed, is set, while all other bits are clear. Next, at a Set Control Bit operation 610, the control registers of all GPIOs program the register bit corresponding to the set wire of the one-hot bus, with the data that is input on the bit-out wires.

Lastly, in a Repeat-Until-Last operation 612, the I/O configuration circuit checks if more control register bits need to be programmed. If so, the flowchart reenters operation 602, to program the next control register bit. If, in operation 612, the I/O configuration circuit determines that no more bits are to be programmed, the flowchart ends.

Figure 6B:
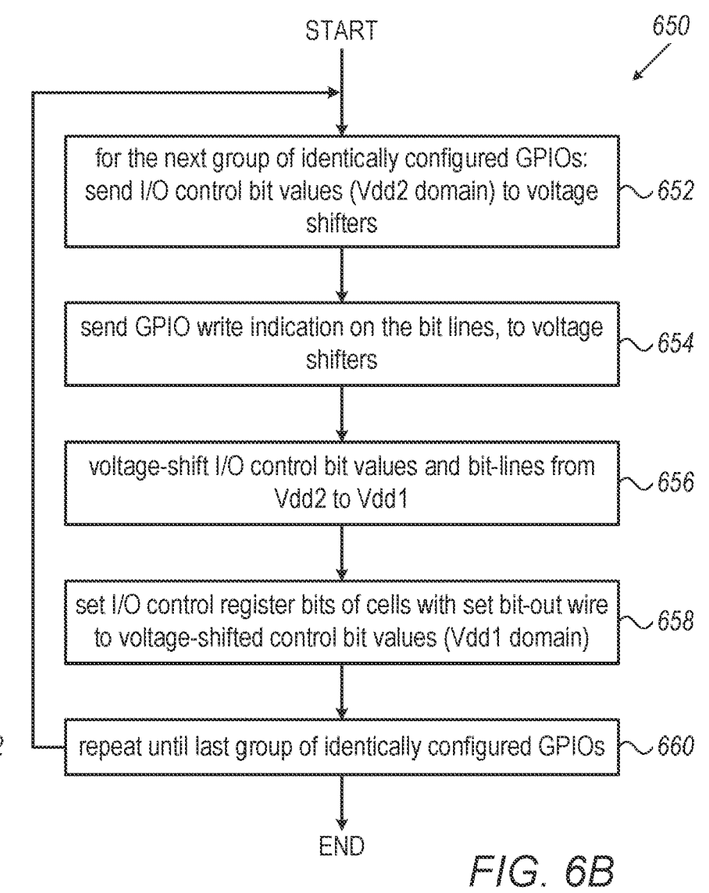
FIG. 6B is a flowchart that schematically illustrates a method for cross voltage domain bit-parallel GPIO configuration in an IC, in accordance with an embodiment of the present disclosure.

FIG. 6B is a flowchart 650 that schematically illustrates a method for cross voltage domain bit-parallel GPIO configuration in an IC, in accordance with an embodiment of the present disclosure. The flowchart is executed by I/O configuration circuit 402, by voltage level shifters 118, 404 and by control registers 408 (FIG. 4).

The flowchart starts at a Send Control Bit Values operation 652, wherein the I/O configuration circuit sends the contents of the control register (all bit in parallel) of a group of GPIOs that should be identically configured. Next, at a Send Write Indication operation 654, the I/O configuration circuit sends an indication (e.g., logic-high) on the bit-wires corresponding to the GPIOs that should be programmed.

Voltage level shifters 118 and 404 then, at a Voltage-Shift operation 656, convert the vdd1 bit-out wires and the contents of the control bus to corresponding vdd2 signals.

Next, each of the I/O configuration registers for which the corresponding bit-out wire indicates a Write, writes the contents of the control bus, in parallel to all its flip-flops.

Lastly, in a Repeat-Until-Last operation 660, the I/O configuration circuit checks if more identically configured GPIOs need to be programmed. If so, the flowchart reenters operation 652, to program the next group of GPIOs. If, in operation 660, the I/O configuration circuit determines that no groups of GPIOs need to be programmed, the flowchart ends.

The configurations of flowcharts 600, 650 illustrated in FIGS. 6A, 6B and described hereinabove are example configurations that are cited for the sake of clarity. Other configurations may be used in alternative embodiments. In some embodiment, the flowcharts are controlled by a dedicated circuit; in other embodiments the flowcharts may be controlled by a processor (e.g., one of processing cores 502, FIG. 5) and in yet other embodiments flowchart control is distributed between the various units illustrated in FIGS. 3,4 and 5.

In an embodiment, a mixed flowchart may be used, which programs some of the GPIOs bit serially and others in a bit-parallel style; in another embodiment, some of the bits are programmed serially and other bits are programmed in parallel.

Although the embodiments described herein mainly address cross power-supply domain GPIO programming, the methods and systems described herein can also be used in other applications, wherein configuration data is communicated between power-supply domains.

Figure 7:
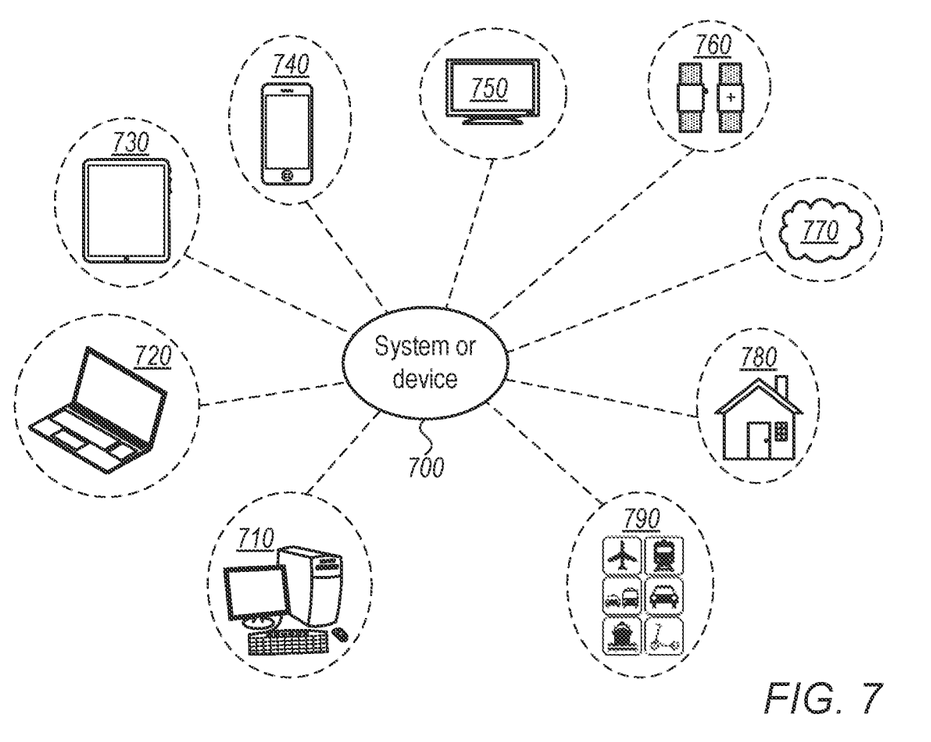
FIG. 7 is a diagram that schematically illustrates various types of systems that may include any of the circuits, devices, or system discussed above, in accordance with embodiments of the present disclosure.

FIG. 7 is a diagram 700 that schematically illustrates various types of systems that may include any of the circuits, devices, or system discussed above, in accordance with embodiments of the present disclosure. System or device 700, which may incorporate or otherwise utilize one or more of the techniques described herein, may be utilized in a wide range of areas. For example, system or device 700 may be utilized as part of the hardware of systems such as a desktop computer 710, laptop computer 720, tablet computer 730, cellular or mobile phone 740, or television 750 (or set-top box coupled to a television).

Similarly, disclosed elements may be utilized in a wearable device 760, such as a smartwatch or a health-monitoring device. Smartwatches, in many embodiments, may implement a variety of different functions, for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 700 may also be used in various other contexts. For example, system or device 700 may be utilized in the context of a server computer system, such as a dedicated server or on shared hardware that implements a cloud-based service 770. Still further, system or device 700 may be implemented in a wide range of specialized everyday devices, including devices 780 commonly found in the home such as refrigerators, thermostats, security cameras, etc. The interconnection of such devices is often referred to as the "Internet of Things" (IoT). Elements may also be implemented in various modes of transportation. For example, system or device 700 could be employed in the control systems, guidance systems, entertainment systems, etc. of various types of vehicles 790.

The applications illustrated in FIG. 7 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 8:
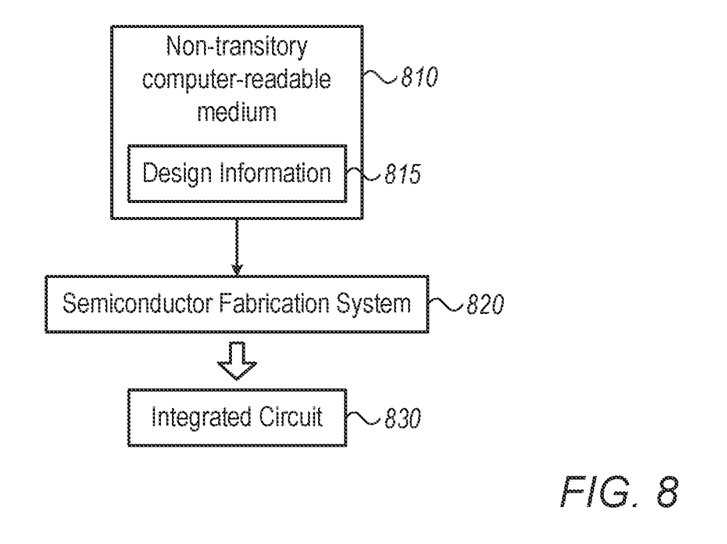
FIG. 8 is a block diagram illustrating an example non-transitory computer-readable storage medium that stores circuit design information, in accordance with embodiments of the present disclosure.

FIG. 8 is a block diagram illustrating an example non-transitory computer-readable storage medium that stores circuit design information, according to some embodiments. In the illustrated embodiment semiconductor fabrication system 820 is configured to process the design information 815 stored on non-transitory computer-readable medium 610 and fabricate integrated circuit 830 based on the design information 815.

Non-transitory computer-readable storage medium 810, may include any of various appropriate types of memory devices or storage devices. Non-transitory computer-readable storage medium 810 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 610 may include other types of non-transitory memory as well or combinations thereof. Non-transitory computer-readable storage medium 810 may include two or more memory mediums which may reside in different locations, e.g., in different computer systems that are connected over a network.

Design information 815 may be specified using any of various appropriate computer languages, including hardware description languages such as, without limitation: VHDL, Verilog, SystemC, SystemVerilog, RHDL, M, MyHDL, etc. Design information 815 may be usable by semiconductor fabrication system 820 to fabricate at least a portion of integrated circuit 830. The format of design information 815 may be recognized by at least one semiconductor fabrication system 820. In some embodiments, design information 815 may also include one or more cell libraries which specify the synthesis, layout, or both of integrated circuit 830. In some embodiments, the design information is specified in whole or in part in the form of a netlist that specifies cell library elements and their connectivity. Design information 815, taken alone, may or may not include sufficient information for fabrication of a corresponding integrated circuit. For example, design information 815 may specify the circuit elements to be fabricated but not their physical layout. In this case, design information 815 may need to be combined with layout information to actually fabricate the specified circuitry.

Integrated circuit 830 may, in various embodiments, include one or more custom macrocells, such as memories, analog or mixed-signal circuits, and the like. In such cases, design information 815 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 620 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 820 may also be configured to perform various testing of fabricated circuits for correct operation.

In various embodiments, integrated circuit 830 is configured to operate according to a circuit design specified by design information 815, which may include performing any of the functionality described herein. For example, integrated circuit 830 may include any of various elements shown in FIGS. 1, 2, 3, 4 and 5. Further, integrated circuit 830 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure. This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

The invention claimed is:

1. An integrated circuit (IC), comprising:
   an Input/Output (I/O) interface, which is coupled to a first voltage domain and is configurable by a set of control bits;
   second-domain circuitry, which is coupled to a second voltage domain and is configured to generate a bit value for a control bit among the control bits, to generate a multi-bit identifier (ID) of the control bit, and to transmit the bit value and the multi-bit ID; and
   first-domain circuitry, which is coupled to the first voltage domain and is configured to receive the bit value and the multi-bit ID, to identify the control bit from the multi-bit ID, and to configure the control bit of the I/O interface with the bit value.

2. The IC according to claim 1, further comprising multiple level shifters configured to transfer the bit value and the multi-bit ID from the second-domain circuitry to the first-domain circuitry.

3. The IC according to claim 2, wherein a number of the level shifters that are assigned to transfer the multi-bit ID is less than a number of the control bits.

4. The IC according to claim 1, further comprising a second I/O interface that is coupled to the first voltage domain, wherein the second domain circuitry is further configured to transmit a second bit value, and the first domain circuitry is configured to configure the control bit of the second I/O interface with the second bit value.

5. The IC according to claim 1, wherein the first-domain circuitry comprises a plurality of storage elements that are configured to retain respective bit values of the control bits.

6. The IC according to claim 1, wherein the second-domain circuitry comprises one or more processor cores configured to communicate with the I/O interface.

7. The IC according to claim 1, wherein a maximum voltage of the first voltage domain exceeds an operating voltage of the second voltage domain by a factor of at least five.

8. An integrated circuit (IC), comprising:
a plurality of Input/Output (I/O) interfaces, which are coupled to a first voltage domain and are each configurable by a respective set of control bits;
second-domain circuitry, which is coupled to a second voltage domain and is configured to generate respective bit values for the control bits, to generate an indication that specifies a subset of one or more of the I/O interfaces that are to be configured with the bit values, and to transmit the bit values and the indication; and
first-domain circuitry, which is coupled to the first voltage domain and is configured to receive the bit values and the indication, to identify the subset of I/O interfaces from the indication, and to configure the I/O interfaces in the subset with the bit values.

9. The IC according to claim 8, further comprising multiple level shifters configured to transfer the bit values and the indication from the second-domain circuitry to the first-domain circuitry.

10. The IC according to claim 8, wherein the first-domain circuitry comprises a plurality of storage elements that are configured to retain the respective bit values of the control bits.

11. The IC according to claim 8, wherein the second-domain circuitry comprises one or more processor cores configured to communicate with the I/O interfaces.

12. The IC according to claim 8, wherein a maximum voltage of the first voltage domain exceeds an operating voltage of the second voltage domain by a factor of at least five.

13. A method, comprising:
operating an Input/Output (I/O) interface, which is coupled to a first voltage domain and is configurable by a set of control bits;
using second-domain circuitry coupled to a second voltage domain, generating a bit value for a control bit among the control bits, generating a multi-bit identifier (ID) of the control bit, and transmitting the bit value and the multi-bit ID; and
using first-domain circuitry coupled to the first voltage domain, receiving the bit value and the multi-bit ID, identifying the control bit from the multi-bit ID, and configuring the control bit of the I/O interface with the bit value.

14. The method according to claim 13, further comprising transferring the bit value and the multi-bit ID from the second-domain circuitry to the first-domain circuitry using multiple level shifters.

15. The method according to claim 14, wherein a number of the level shifters that are assigned to transfer the multi-bit ID is less than a number of the control bits.

16. The method according to claim 13, further comprising:
operating a second I/O interface that is coupled to the first voltage domain;
transmitting a second bit value using the second domain circuitry; and
configuring the control bit of the second I/O interface with the second bit value using the first domain circuitry.

17. The method according to claim 13, further comprising retaining respective bit values of the control bits using a plurality of storage elements in the first-domain circuitry.

18. The method according to claim 13, wherein generating and transmitting the bit value and the multi-bit ID comprise communicating with the I/O interface using one or more processor cores in the second-domain circuitry.

19. The method according to claim 13, wherein a maximum voltage of the first voltage domain exceeds an operating voltage of the second voltage domain by a factor of at least five.

* * * * *